US008737537B2

(12) United States Patent
Pitsch

(10) Patent No.: US 8,737,537 B2
(45) Date of Patent: May 27, 2014

(54) FREQUENCY TRANSLATION MODULE FREQUENCY LIMITING AMPLIFIER

(75) Inventor: Robert Alan Pitsch, Carmel, IN (US)

(73) Assignee: Thomson Licensing, Issy les Moulineaux (FR)

( * ) Notice: Subject to any disclaimer, the term of this patent is extended or adjusted under 35 U.S.C. 154(b) by 845 days.

(21) Appl. No.: 12/225,641

(22) PCT Filed: Mar. 13, 2007

(86) PCT No.: PCT/US2007/006299
§ 371 (c)(1),
(2), (4) Date: Sep. 26, 2008

(87) PCT Pub. No.: WO2007/126573
PCT Pub. Date: Nov. 8, 2007

(65) Prior Publication Data
US 2010/0172441 A1   Jul. 8, 2010

Related U.S. Application Data

(60) Provisional application No. 60/787,072, filed on Mar. 29, 2006.

(51) Int. Cl.
*H03D 3/00* (2006.01)
*H04L 27/14* (2006.01)

(52) U.S. Cl.
USPC .......................................... 375/334

(58) Field of Classification Search
USPC ......... 375/141, 146, 147, 149, 229, 319, 322, 375/324, 334, 344; 330/107, 250, 260, 306, 330/310
See application file for complete search history.

(56) References Cited

U.S. PATENT DOCUMENTS 3,628,063 A * 12/1971 Tamari .......................... 327/102
(Continued)

FOREIGN PATENT DOCUMENTS

EP       0394084    10/1990
EP       0887976    12/1998
(Continued)

OTHER PUBLICATIONS

International Search Report, dated Dec. 18, 2007.
(Continued)

*Primary Examiner* — Sam K Ahn
*Assistant Examiner* — Syed Haider
(74) *Attorney, Agent, or Firm* — Robert D. Shedd; Kuniyuki Akiyama

(57) ABSTRACT

A system for processing signal communications between a frequency translation module and an integrated receiver decoder. According to an exemplary embodiment, the decoder and the frequency translation module comprise a signal processing apparatus comprising an input for receiving an frequency shift keyed modulated signal, an amplifier having negative feedback coupled to said input, wherein said input is further coupled to a first source of reference potential and a second source of reference potential; and a tank circuit coupled between said differential amplifier and an output. More particularly, the amplifier may comprise a first transistor having a first collector, a first emitter and a first base coupled to a signal source wherein said first base is further coupled to said first collector and a second transistor with a second base, a second emitter coupled to said first emitter, and a second collector, wherein said second collector is coupled to a bandpass filter and said bandpass filter is further coupled to an output.

6 Claims, 4 Drawing Sheets

(56) References Cited

U.S. PATENT DOCUMENTS

| | | | |
|---|---|---|---|
| 3,784,923 A | | 1/1974 | Rezek |
| 3,885,644 A | | 5/1975 | Seidler et al. |
| 3,999,138 A | * | 12/1976 | Peil et al. ............... 329/317 |
| 4,103,244 A | * | 7/1978 | Tan ............... 329/302 |
| 4,193,034 A | | 3/1980 | Vance |
| 4,322,851 A | | 3/1982 | Vance |
| 4,393,499 A | | 7/1983 | Evans |
| 4,479,259 A | * | 10/1984 | Fenk ............... 455/318 |
| 4,551,846 A | * | 11/1985 | Takeda et al. ............... 375/328 |
| 4,999,528 A | | 3/1991 | Keech |
| 5,315,660 A | * | 5/1994 | Anderson et al. ............... 381/13 |
| 6,332,007 B1 | * | 12/2001 | Sasaki ............... 375/344 |
| 7,518,438 B2 | * | 4/2009 | Kato ............... 329/315 |
| 2003/0141928 A1 | * | 7/2003 | Lee ............... 330/252 |
| 2005/0105653 A1 | * | 5/2005 | Mizuno ............... 375/334 |

FOREIGN PATENT DOCUMENTS

| | | |
|---|---|---|
| GB | 2189114 | 10/1997 |
| JP | 5046241 | 4/1975 |
| JP | 50141956 | 11/1975 |
| JP | 56-100531 | 8/1981 |
| JP | 5762410 | 4/1982 |
| JP | 5724686 | 5/1982 |
| JP | 59137616 | 9/1984 |
| JP | 2-36267 | 3/1990 |
| JP | 3263907 | 11/1991 |
| JP | 6188651 | 7/1994 |
| JP | 6188777 | 7/1994 |
| JP | 7087140 | 3/1995 |
| JP | 8139769 | 5/1996 |
| JP | 11127257 | 5/1999 |
| JP | 11-274871 | 10/1999 |
| JP | 11-340766 | 12/1999 |
| NL | 8004865 | 3/1981 |
| SU | 1327316 | 7/1987 |
| WO | 01/24385 A2 | 4/2001 |
| WO | 2004/010250 A2 | 1/2004 |

OTHER PUBLICATIONS

Salgado et al: "Accurate Performance Modelong of Subcarner Multiplexed Fiber/Radio Systems: Implications of Laser Nonlinear Distortion and Wide Dynamic Range" IEEE. Trans. on Communications, vol. 44, No. 8, pp. 988-996 Aug. 1996.

Flaxl, T. "System Evaluation Analog Front End Design Considerations and Software Concept for the TIRIS Dig. Receiver Module", Proc. of European Conf. on Circuit Theory & Design, ECCTD'99, Torino, Italy, 1909, vol. 1, pp. 37-40.

Gouda et al: A Low Cost 110 dB CMOS IF/Limiter Amplifier with Offset Cancellation, Proc. of the $15^{th}$ Int'l Conf. Microelectronics, Giza, Egypt, 2003, xviii+419 pp.

Ugajin et al: A 1-V 2.4-GHz Downconverter for FSK Wireless Applications w/ a Complex BPF and a Frequency Doubler in CMOS/SOI; IEICE Transactions oln Electronics, vet. E87-C, No. 6, pp. 888-804, Jun. 2004.

Fishstein, Am: "Phase-Amplitude Relationships in Frequency-Selective Li miting Amplifiers", Izvestiya Vysshikh Uchebnykh Zavedenii, Priborostroenie, vol. 21. No. 6, pp. 88-93, 1978.

Huang et al: "A 2-V CMOS 455 kHz FM/FSK DemoDULATOR Using Feedforward Onset XCancellation Limiting Amplifier", Proc. of $2^{nd}$ IEEE Asia Pac Conf on ASICs, 2000, pp. 155-158, Piscataway, New Jersey, 2000 xii+384 pp.

Rauscfier, C.: "A ChannelizedLimiter Approach to Receiver Front-End Protection", IEEE Translation on Microwave Theory & Tech., vol. 44, No. 7, pp. 1125-1129, Jul. 1999.

Gerrits et al: "Principles & Limitations of Ultra Wideband FM CommunicATIONS Systems", EURASIP Journal Applied Signal Processing, vol. 2005, No. 3, pp. 382-396, Mar. 1, 2005.

Goffart et al: "An S-FSK Power Line Carrier Line Modem for Utility AMR Applications", $9^{th}$ Int'l Conf. on Metering & Tariffs for Energy Supply, Pub. #462, pp. 81-85, London, UK, May 25-28, 1999, viii+278.

* cited by examiner

FREQUENCY TRANSLATION MODULE FREQUENCY LIMITING AMPLIFIER

CROSS REFERENCE TO RELATED APPLICATION

This application claims the benefit, under 35 U.S.C. §365 of International Application PCT/US07/006299, filed on Mar. 13, 2007, which was published in accordance with PCT Article 21 (2) on Nov. 8, 2007, in English and which claims the benefit of U.S. Provisional Patent Application No. 60/787,072, filed on Mar. 29, 2006, in English.

BACKGROUND OF THE INVENTION

1. Field of the Invention

The present invention generally relates to signal communications, and more particularly, to an architecture and protocol for processing signal communications between a frequency translation apparatus, which may be referred to herein as a frequency translation module (FTM), and an integrated receiver-decoder (IRD).

2. Background Information

In a satellite broadcast system, one or more satellites receive signals including audio and/or video signals from one or more earth-based transmitters. The satellite(s) amplify and rebroadcast these signals to signal receiving equipment at the dwellings of consumers via transponders that operate at specified frequencies and have prescribed bandwidths. Such a system includes an uplink transmitting portion (i.e., earth to satellite(s)), an earth-orbiting satellite receiving and transmitting portion, and a downlink portion (i.e., satellite(s) to earth).

In dwellings that receive signals from a satellite broadcast system, signal receiving equipment may be used to frequency shift the entire broadcast spectrum of the satellite(s), and frequency stack the resultant output onto a single coaxial cable. That is, the frequency spectrum associated with one set of signals is shifted to the frequencies adjacent to, or different from, the frequency spectrum of another set of signals, thereby positioning or stacking the sets of signals in the frequency domain. As the number of satellites within a satellite broadcast system increases, and with the proliferation of high definition satellite channels, a point will be reached where the total bandwidth required to accommodate all of the satellites will exceed the transmission capability of the coaxial cable. It has become necessary for the satellite decoder industry to implement more satellite slots into their distribution systems. To provide for the increased number of satellite slot transmissions a more elaborate means for satellite configurations selection has been developed called the frequency translation module (FTM) method.

An FTM for delivering satellite signals to Integrated Receiver Decoders (IRDs) comprises one or more input/outputs (I/Os) coupled to low noise block amplifiers (LNB), and one or more input/outputs coupled to IRDs. The FTM module operative to receive requests from the IRD indicating desired satellite program channels. In response to the request from the IRD, the FTM module controls the appropriate LNB such that the requested channel, or block of channels is delivered to the FTM IO. The FTM module then may frequency shift the requested channel to a second frequency corresponding to an unoccupied frequency on the transmission line to the IRDs. The FTM module zo then communicates to the requesting IRD the frequency on which the requested channel is being supplied. When the FTM is operative to couple a plurality of satellite program channels to a plurality of IRDs, the FTM individually commands each LNB to supply the desired channels or band of channels, and outputs each of the desired channels or band of channels on the same transmission line to the IRDs, with each desired channel or band of channels modulated at unique frequencies.

The FTM uses a UART controlled 2.3 MHz, Frequency Shift Key (FSK) modulation scheme to communicate selection commands to the IRDs and the FTM. Present day satellite decoder systems use complicated PLL and superhetrodyne receivers to amplify the narrow band required for FSK reception with no conversion or detection. This results in an undesirably expensive implementation that must be implemented in each IRD and FTM, the cost being far more than the cost of the legacy DiSEqC communication system. There is a need for a low cost FSK signal processing means with frequency filter, amplitude limiting, and wide dynamic range without the need for an expensive AGC system. The present invention described herein addresses this and/or other problems.

SUMMARY OF THE INVENTION

In accordance with an aspect of the present invention, an apparatus for processing an FSK signal is disclosed. According to an exemplary embodiment, the apparatus comprises an input for receiving an frequency shift keyed modulated signal, an amplifier having negative feedback coupled to said input, wherein said input is further coupled to a first source of reference potential and a second source of reference potential; and a tank circuit coupled between said differential amplifier and an output.

In accordance with another aspect of the present invention, an FSK signal processing apparatus is disclosed. According to an exemplary embodiment, the FSK signal processing apparatus comprises a first transistor having a first collector, a first emitter and a first base coupled to a signal source wherein said first base is further coupled to said first collector; and a second transistor with a second base, a second emitter coupled to said first emitter, and a second collector, wherein said second collector is coupled to a bandpass filter and said bandpass filter is further coupled to an output.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

It is desirable to disconnect the low impedance LNB power supply output impedance from the FTM circuits when in the FTM mode by effectively raising the LNB power supply output impedance when in the FTM mode. As a voltage source, conventional LNB power supplies represent a low impedance to ground. This low impedance, if uninterrupted, overloads the modulated 2.3 MHz FTM signal causing waveform distortion. An aspect of the present invention involves disconnecting a low impedance output of an LNB power supply from a communication network, such as a 2.3 MHz communication network.

Figure 1:
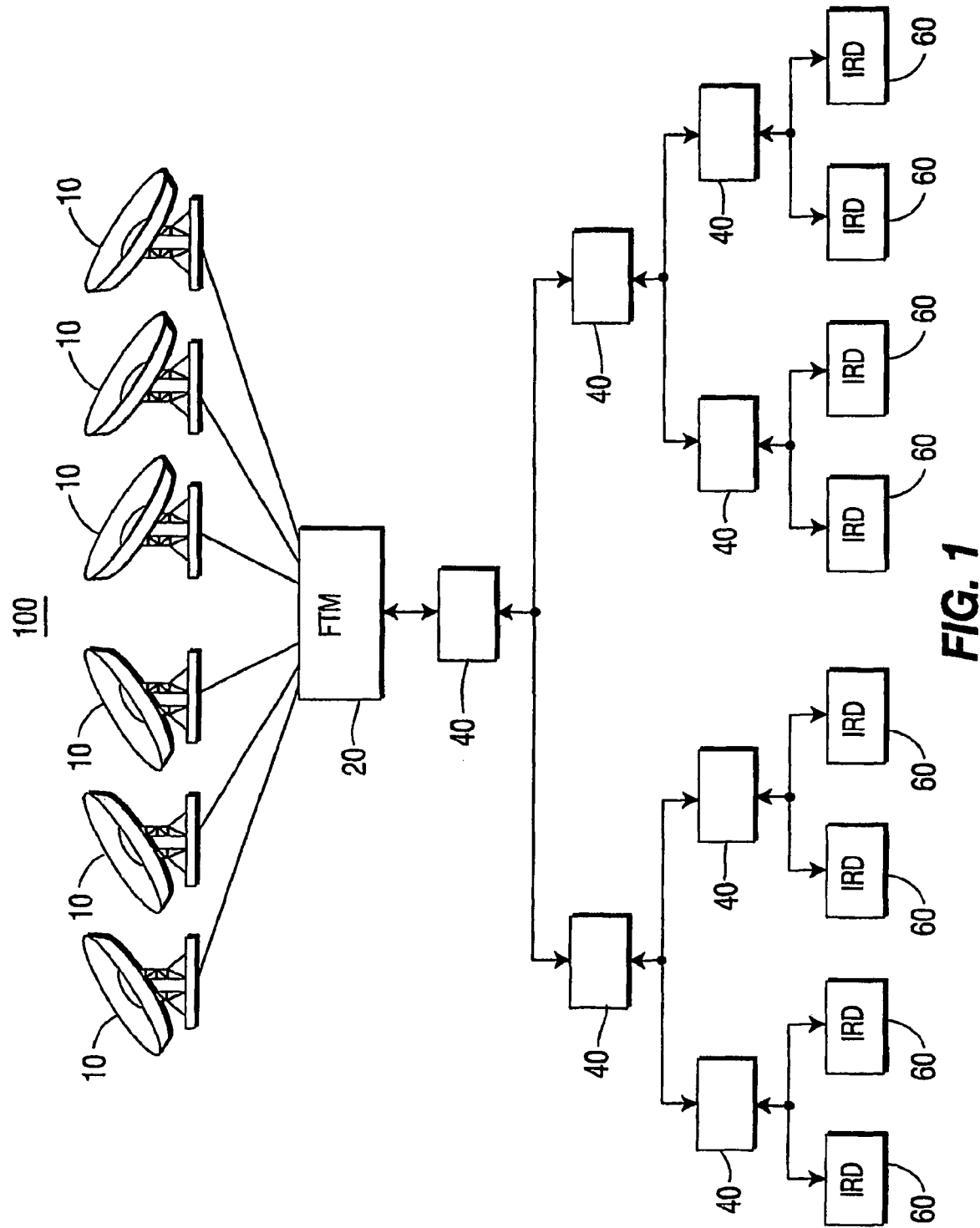
FIG. 1 is a diagram showing an exemplary environment for implementing the present invention.

Referring now to the drawings, and more particularly to FIG. 1, a diagram of an exemplary embodiment 100 for implementing the present invention is shown. Embodiment 100 of FIG. 1 comprises a plurality of signal receiving means such as signal receiving elements or devices 10, such as parabolic antennas in is exemplary embodiment of the invention, frequency translating means such as FTM 20, a plurality of signal splitting means such as signal splitters 40, and a plurality of signal receiving and decoding means such as IRDs 60. According to an exemplary embodiment described herein, the aforementioned elements of embodiment 100 are operatively coupled to one another via a transmission medium such as coaxial cable, although other types of transmission mediums may also be used according to the present invention. Embodiment 100 may for example represent a signal communication network within a given household and/or business.

Signal receiving elements 10 are each operative to receive signals including audio, video, and/or data signals (e.g., television signals, etc.) from one or more signal sources, such as a satellite broadcast system and/or other type of signal broadcast system. According to an exemplary embodiment, signal receiving element 10 is embodied as an antenna such as a satellite receiving dish, but may also be embodied as any type of signal receiving element.

FTM 20 is operative to receive signals including audio, video, and/or data signals (e.g., television signals, etc.) from signal receiving elements 10, and process the received signals using functions including signal tuning and frequency translation functions to generate corresponding output signals that are provided to IRDs 60 via coaxial cable and signal splitters 40. According to an exemplary embodiment, FTM 20 may communicate with a plurality IRDs 60 within a system. For purposes of example and explanation, however, FIG. 1 shows FTM 20 connected to 8 IRDs 60 using simple two-way signal splitters 40. Further exemplary details regarding FTM 20, and its ability to communicate with IRDs 60 will be provided later herein.

Signal splitters 40 are each operative to perform a signal splitting and/or repeating function. According to an exemplary embodiment, signal splitters 40 are each operative to perform a 2-way signal splitting function to facilitate signal communication between FTM 20 and IRDs 60.

IRDs 60 are each operative to perform various signal receiving and processing functions including signal tuning, demodulation and decoding functions. According to an exemplary embodiment, each IRD 60 is operative to tune, demodulate and decode signals provided from FTM 20 via signal splitters 40, and enable aural and/or visual outputs corresponding to the received signals. As will be described later herein, such signals are provided from FTM 20 to IRDs 60 responsive to request commands from IRDs 60, and such request commands may each represent a request for a desired band of television signals. With a satellite broadcast system, each request command may for example indicate a desired satellite and/or a desired transponder. The request commands may be generated by IRDs 60 responsive to user inputs (e.g., via remote control devices, etc.).

According to an exemplary embodiment, each IRD 60 also includes an associated audio and/or video output device such as a standard-definition (SD) and/or high-definition (HD) display device. Such display device may be integrated or non-integrated. Accordingly, each IRD 60 may be embodied as a device such as a television set, computer or monitor that includes an integrated display device, or a device such as a set-top box, video cassette recorder (VCR), digital versatile disk (DVD) player, video game box, personal video recorders (PVR), computer or other device that may not include an integrated display device.

Figure 2:
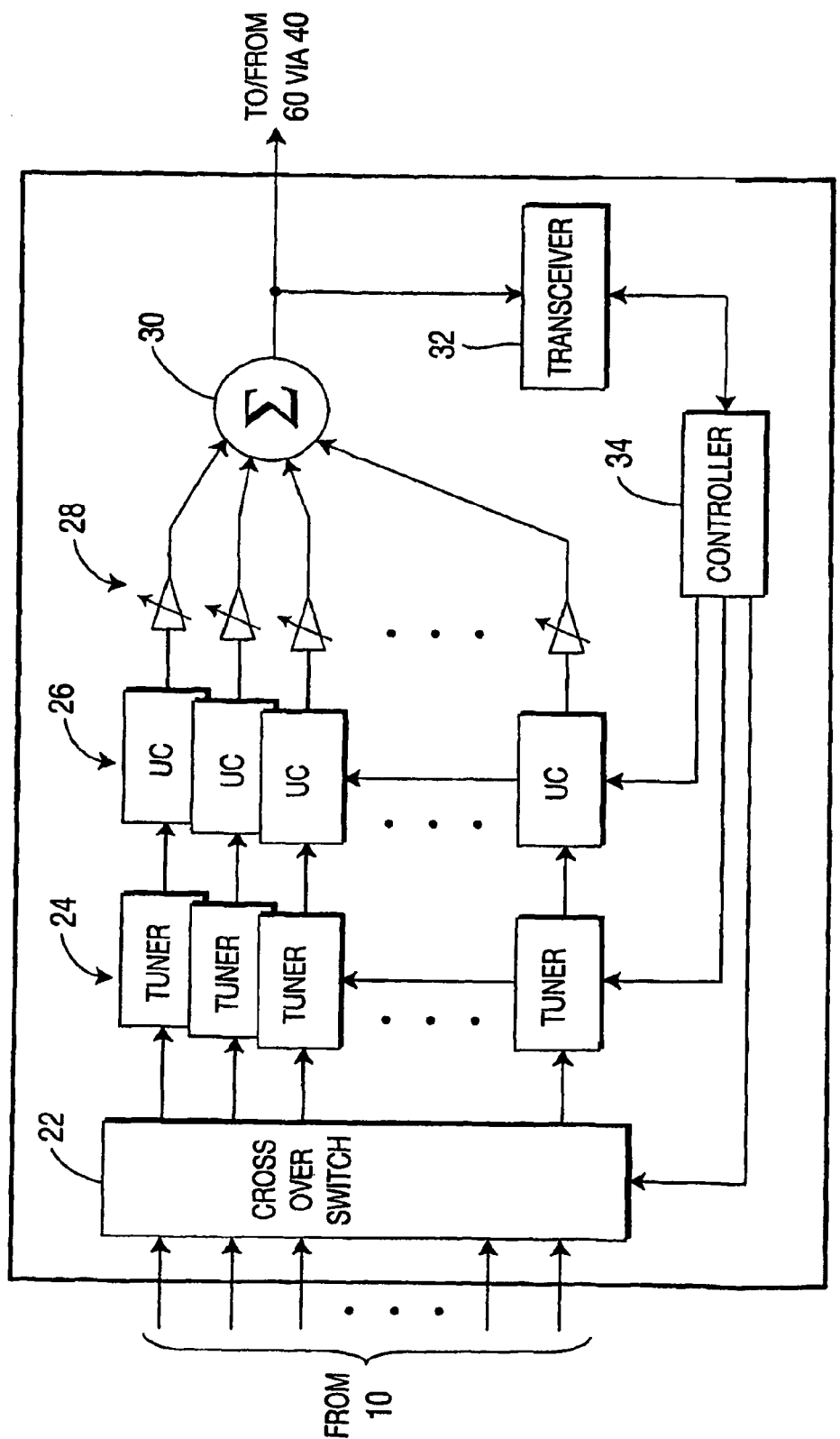
FIG. 2 is a block diagram showing further details of the FTM of FIG. 1 according to an exemplary embodiment of the present invention.

Referring to FIG. 2, a block diagram providing further details of FTM 20 of FIG. 1 according to an exemplary embodiment of the present invention is shown. FTM of FIG. 2 comprises switching means such as cross over switch 22, a plurality of tuning means such as tuners 24, a plurality of frequency converting means such as frequency up converters (UCs) 26, a plurality of amplifying means such as variable gain amplifiers 28, signal combining means such as signal combiner 30, transceiving means such as transceiver 32, and control means such as controller 34. The foregoing elements of FTM 20 may be implemented using integrated circuits (ICs), and one or more elements may be included on a given IC. Moreover, a given element may be included on more than one IC. For clarity of description, certain conventional elements associated with FTM 20 such as certain control signals, power signals and/or other elements may not be shown in FIG. 2.

Cross over switch 22 is operative to receive a plurality of input signals from signal receiving elements 10. According to an exemplary embodiment, such input signals represent various bands of radio frequency (RF) television signals. With a satellite broadcast system, such input signals may for example represent L-band signals, and cross over switch 22 may include an input for each signal polarization used within the system. Also according to an exemplary embodiment, cross over switch 22 selectively passes the RF signals from its inputs to specific designated tuners 24 responsive to control signals from controller 34.

Tuners 24 are each operative to perform a signal tuning function responsive to a control signal from controller 34. According to an exemplary embodiment, each tuner 24 receives an RF signal from cross over switch 22, and performs the signal tuning function by filtering and frequency down is converting (i.e., single or multiple stage down conversion) the RF signal to thereby generate an intermediate frequency (IF) signal. The RF and IF signals may include audio, video and/or data content (e.g., television signals, etc.), and may be of an analog signal standard (e.g., NTSC, PAL, SECAM, etc.) and/or a digital signal standard (e.g., ATSC, QAM, QPSK, etc.).

Frequency up converters (UCs) 26 are each operative to perform a frequency translation function. According to an exemplary embodiment, each frequency up converter (UC) 26 includes a mixing element and a local oscillator (not shown in FIGS.) that frequency up converts an IF signal provided from a corresponding tuner 24 to a designated frequency band responsive to a control signal from controller 34 to thereby generate a frequency up converted signal.

Variable gain amplifiers 28 are each operative to perform a signal amplification function. According to an exemplary embodiment, each variable gain amplifier 28 is operative to amplify a frequency converted signal output from a corresponding frequency up converter (UC) 26 to thereby generate an amplified signal. Although not expressly shown in FIG. 2, the gain of each variable gain amplifier 28 may be controlled via a control signal from controller 34.

Signal combiner 30 is operative to perform a signal combining (i.e., summing) function. According to an exemplary embodiment, signal combiner 30 combines the amplified signals provided from variable gain amplifiers 28 and outputs the resultant signals onto a transmission medium such as coaxial cable for transmission to one or more IRDs 60 via signal splitters 40.

Transceiver 32 is operative to enable communications between FTM 20 and IRDs 60. According to an exemplary embodiment, transceiver 32 receives various signals from IRDs 60 and relays those signals to controller 34. Conversely, transceiver 32 receives signals from controller 34 and relays those signals to one or more IRDs 60 via signal splitters 40. Transceiver 32 is may for example be operative to receive and transmit signals in one or more predefined frequency bands. Further exemplary details regarding transceiver 32, and its operation will be provided later herein.

Controller 34 is operative to perform various control functions. According to an exemplary embodiment, controller 34 receives request commands for desired bands of television signals from IRDs 60. As will be described later herein, each IRD 60 may transmit its request command to FTM 20 during a separate time slot that is assigned by controller 34. With a satellite broadcast system, a request command may indicate a desired satellite and/or a desired transponder that provides a desired band of television signals. Controller 34 enables signals corresponding to the desired bands of television signals to be transmitted to corresponding IRDs 60 responsive to the request commands.

According to an exemplary embodiment, controller 34 provides various control signals to cross over switch 22, tuners 24, and frequency up converters (UCs) 26 that cause the signals corresponding to the desired bands of television signals to be transmitted to IRDs 60 via a transmission medium such as coaxial cable. Controller 34 also provides acknowledgement responses to IRDs 60 responsive to the request commands which indicate the frequency bands (e.g., on the coaxial cable, etc.) that will be used to transmit the signals corresponding to the desired bands of television signals to IRDs 60. In this manner, controller 34 may allocate the available frequency spectrum of the transmission medium (e.g., coaxial cable, etc.) so that all IRDs 60 can receive desired signals simultaneously.

Figure 3:
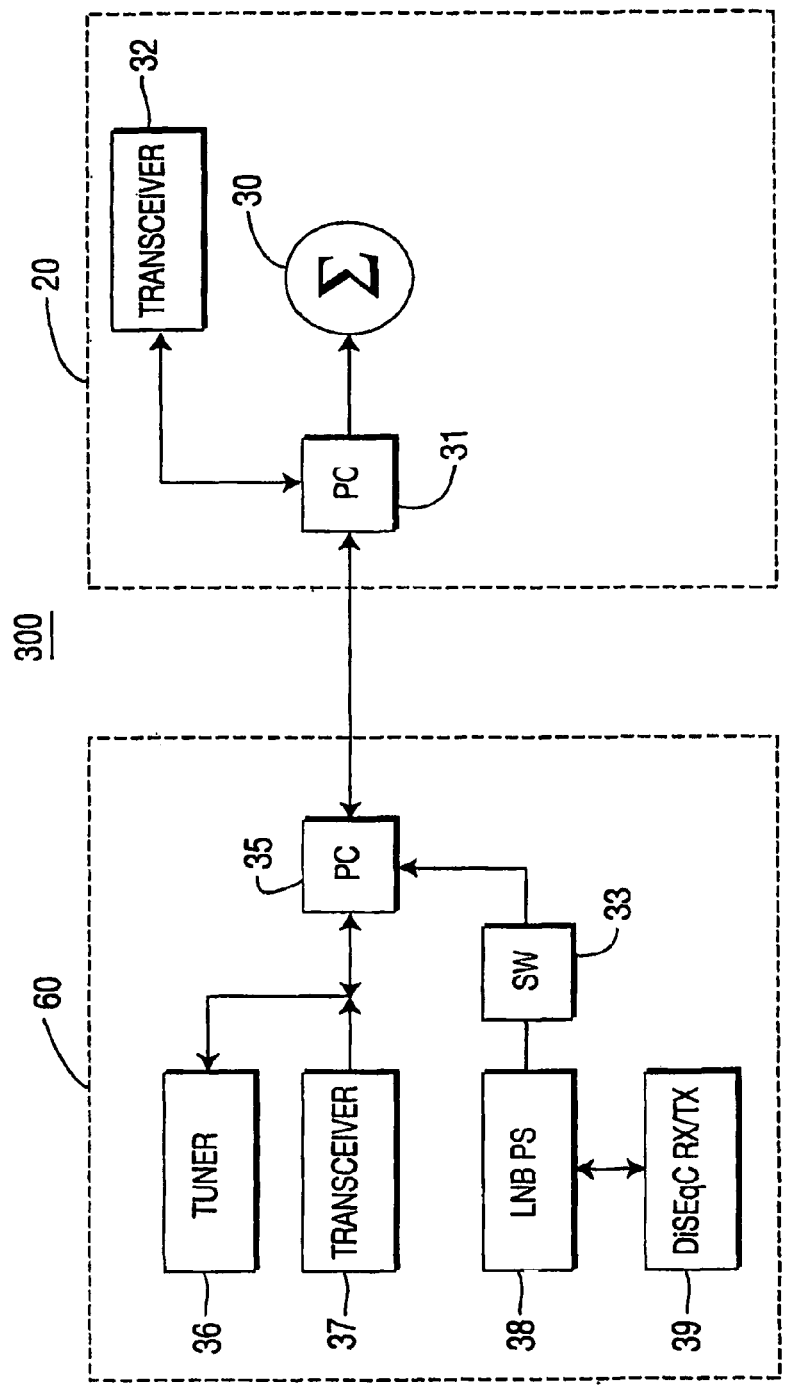
FIG. 3 is a diagram showing further details of the interconnectivity between the FTM 20 and IRD 60 of FIG. 1 according to an exemplary embodiment of the present invention.

Referring to FIG. 3, a diagram of an exemplary embodiment 300 for implementing aspects of the present invention, shows further details of the interconnectivity between the FTM 20 and IRD 60 of FIG. 1. Embodiment 300 of FIG. 3 comprises a protection circuit 31, a transceiver 32, and a signal combiner 30 within the FTM 20. Within the IRD 60, a tuner 36, a transceiver 37, an LNB power supply 38, a DiSEqC encoder/decoder 39, a switch 33, and a protection circuit 35 are shown.

Protection circuit 31 is operative to pass desired signals, such as FTM control signals and television signals without distortion while protecting the FTM circuitry from lightning surge and other environmental electrical disturbances. According to an exemplary embodiment, protection circuit 31 comprises devices such as surge protection diodes implemented to absorb energy from positive and negative lightning surge events. The surge protection diodes are configured not to present a non-linear conduction path to the 2.3 MHz FTM signal.

Signal combiner 30 is operative to perform a signal combining (i.e., summing) function. According to an exemplary embodiment, signal combiner 30 combines the amplified signals provided from variable gain amplifiers 28 and outputs the resultant signals onto a transmission medium such as coaxial cable for transmission to one or more IRDs 60 via signal splitters 40.

Transceiver 32 is operative to enable communications between FTM 20 and IRDs 60. According to an exemplary embodiment, transceiver 32 receives various signals from IRDs 60 and relays those signals to controller 34. Conversely, transceiver 32 receives signals from controller 34 and relays those signals to one or more IRDs 60 via signal splitters 40. Transceiver 32 may for example be operative to receive and transmit signals in one or more predefined frequency bands. Further exemplary details regarding transceiver 32, and its operation will be provided later herein.

Similarly to protection circuit 31, protection circuit 35 is operative to pass desired signals, such as FTM control signals and television signals without distortion while protecting the IRD 60 circuitry from lightning surge and other environmental electrical disturbances. According to an exemplary embodiment, protection circuit 35 comprises surge protection diodes implemented to absorb energy from positive and negative lightning surge events. The surge protection diodes are configured not to present a non-linear conduction path to the 2.3 MHz FTM signal or the incoming television signals transmitted from the FTM 20.

Tuner 36 is operative to perform a signal tuning function responsive to a control signal from IRD controller in response to a channel selection from the user. According to an exemplary embodiment, the tuner receives an RF signal from protection circuit 35, and performs the signal tuning function by filtering and frequency down converting (i.e., single or multiple stage down conversion) the RF signal to thereby generate an intermediate frequency (IF) signal. The RF and IF signals may include audio, video and/or data content (e.g., television signals, etc.), and may be of an analog signal standard (e.g., NTSC, PAL, SECAM, etc.) and/or a digital signal standard (e.g., ATSC, QAM, QPSK, etc.).

Transceiver 37 is operative to enable communications between FTM 20 and IRDs 60. According to an exemplary embodiment, transceiver 37 receives various signals from FTM 20 and relays those signals to the IRD controller. Conversely, transceiver 37 receives signals from IRD controller and relays those signals to the FTM via coaxial cable and protection circuits 31 and 35. Transceiver 37 may for example be operative to receive and transmit signals in one or more predefined frequency bands. Further exemplary details regarding transceiver 37, and its operation will be provided later herein through the exemplary description of transceiver 32, which operates and communicates in a substantially similar manner to transceiver 37.

The LNB power supply 38 is operative to generate the required operating DC power for the LNBs when the system is operating in Legacy LNB mode. In Legacy more, the LNB is operative to receive communications from the set top box via pulsed tones coupled to the LNB power supply lines. According to an exemplary embodiment, the LNB power supply 38 is a to conventional LNB power supply comprising a DC to DC, Boost switching power supply, with the ability to power down or disable the output. The LNB power supply comprises a linear regulator which can superimpose a 22 kHz tone onto the DC output voltage. The output of the linear regulator is typically a push-pull type, but can equally be other configurations, such as emitter is follower type output.

The switch 33 is operative to couple the LNB power supply 38 to the protection circuit 35 with a low impedance when the IRD 60 is operating in the Legacy mode. The switch 33 decouples the LNB power supply 38 from the protection circuit 35 with a high impedance when the IRD 60 is operating in the FTM mode.

The DiSEqC encoder and decoder 39 is operative to generate the required control tones to communicate to the LNBs when the IRD is operating in the Legacy mode. According to an exemplary embodiment, there are two 22 kHz tone modes, constant tone and two-way pulse width modulated (PWM) tone control mode. When the LNB regulator is transmitting tone, the DiSEqC encoder and decoder 39 provides a low impedance output to the switch 33.

Figure 4:
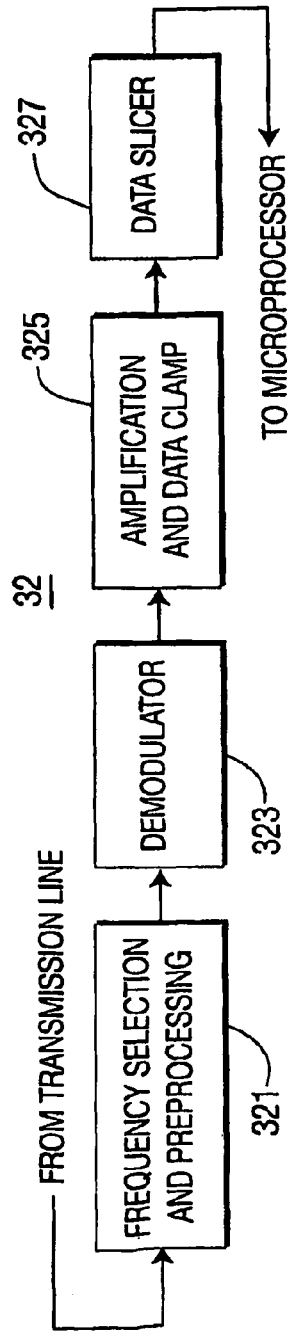
FIG. 4 is a diagram of an exemplary embodiment for implementing the present invention showing further details of the transceiver 32 of FIG. 3.

FIG. 4 is a diagram of an exemplary embodiment for implementing the present invention showing further details the transceiver 32 of FIG. 3. While reference is made to the transceiver 32 of the FTM 20 of FIG. 3 in this exemplary embodiment, the transceiver and the described circuitry can equally be implemented in the IRD 60. The transceiver of environment 32 comprises frequency selection and preprocessing circuitry 321, a demodulator 323, amplification and data clamp circuitry 325, and a data slicer 327. The transceiver of environment 32 comprises frequency selection and preprocessing circuitry 321, a demodulator 323, amplification and data clamp circuitry 325, and a data slicer 327.

The frequency selection and preprocessing circuitry 321 is operative to receive the 2.3 MHz FSK FTM control signals from an FTM control module via the transmission line. The frequency selection and preprocessing circuitry 321 prefilters the received FSK to signal to remove unwanted spurious and adjacent channel signals present at nearby frequencies. The frequency selection and preprocessing circuitry 321 the amplifies or attenuates the received signal such that the amplitude of the received signal is within a is predetermined range such that it is suitable for coupling to the demodulator 323. Further exemplary details of the frequency selection and preprocessing circuitry 321, and its operation will be provided later herein The demodulator 323 is operative to receive the filtered and amplitude adjusted FSK FTM control signals from the frequency selection and preprocessing circuitry 321. The demodulator 323 converts the frequency shift keyed digitally modulated RF signal into a binary baseband signal suitable for further digital processing. The demodulator may accomplish this objective by stripping a portion of the 2.3 MHZ carrier signal from the FSK FTM control signal to extract the two discrete frequencies that comprise the binary data present in the FSK signal. The demodulator 323 then designates one frequency as the "mark" frequency and the other as the "space" frequency. The mark and space correspond to binary one and zero, respectively. By convention, mark corresponds to the higher radio frequency. The binary signal is then passed to the amplification and data clamp circuitry 325.

The amplification and data clamp circuitry 325 is operative to prefilter the received binary signal to remove unwanted spurious noise and to condition the signal to minimize bit errors and maximize signal quality. The amplification and data clamp circuit 325 amplifies or attenuates the received binary signal such that the amplitude of the binary signal is within a predetermined range such that it is suitable for coupling to the data slicer 327. Further exemplary details amplification and data clamp circuitry 325, and its operation will be provided later herein.

The data slicer 327, sometimes called a zero threshold crossing detector, comprises circuitry used to detect and indicate instances when an input signal crosses a predetermined threshold, such as the 0 volt level. An exemplary embodiment of this circuit is an operational amplifier with the input signal applied to the positive input and the negative input grounded. The resulting signal output from the operation amplifier will have a positive value when the input voltage is positive, and when the input voltage is negative, the output voltage is a negative value. The magnitude of the output voltage is a property of the operational amplifier and its power supply. Another exemplary embodiment of a data slicer feeds the input signal into both the positive terminal of the operational amplifier and into a threshold detector, the threshold detector generates a middle or average voltage level for the baseband signal. The output of the threshold detector is then fed to the negative terminal of the operational amplifier. The operational amplifier output is then a positive value when the input signal is higher than the average voltage level for the baseband signal, or negative when the input signal is lower than the average level for the baseband signal. Again, the magnitude of the output voltage is a property of the operational amplifier and its power supply. The output of the data slicer 327 is then applied to the microprocessor.

Figure 5:
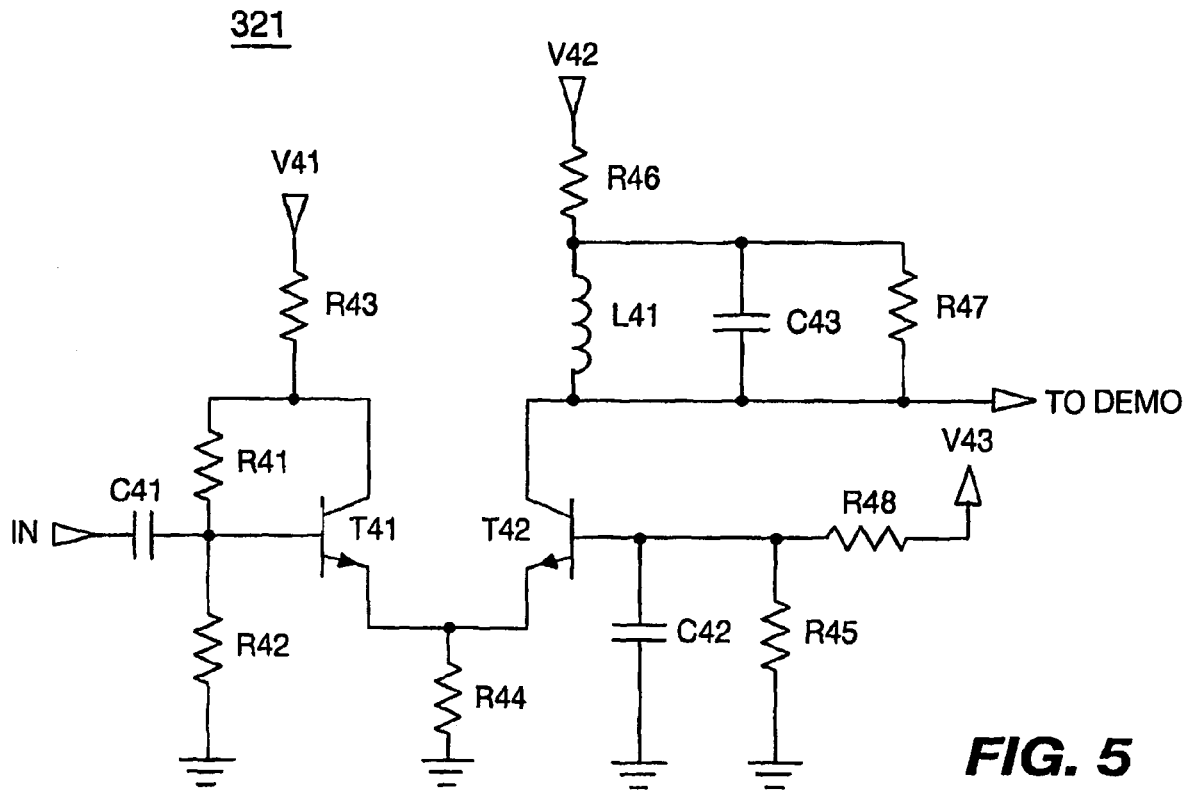
FIG. 5 is a diagram of an exemplary embodiment for implementing the present invention showing further details of the frequency selection and preprocessing circuitry 321 of FIG. 4.

FIG. 5 is a diagram of an exemplary embodiment for implementing an aspect of the present invention showing further details the frequency selection and preprocessing circuitry 321 of FIG. 4. The frequency selection and preprocessing circuitry 321 comprises differential amplifier comprising a first transistor configured as an emitter follower T41 and a second transistor configured as common base amplifier T42. The emitter follower T41 offers a high input impedance and has negative feedback through resistor R41. Resistors R43, R41, and R42 create a voltage divider circuit for regulating the voltage provided by the first voltage supply V41 and the input FSK signal IN at the base and to the collector of the emitter follower T41. The negative feedback through resistor R41 keeps the circuit from oscillation and limits the input signal coupling to the common base amplifier T42 to the voltage supplied by the first voltage supply V41. The minimum voltage supplied to the base of the emitter follower T41 is limited to the voltage generated across resistor R42. Capacitor C41 couples the input FSK signal IN to the base of the emitter follower T41 as well as limiting unwanted dc bias generated outside of the frequency selection and preprocessing circuitry 321.

A third voltage source biases the base of the common base amplifier T42 through resistors R48 and R45 configured as a voltage dividers and capacitor C42. This common base amplifier configuration is useful for high frequency applications because the base separates the input and output, minimizing oscillations at high frequency. It has a high voltage gain, relatively low input impedance and high output impedance compared to the common collector configuration. Resistors R46 and R44 divide the voltage supplied by a second voltage source V42.

Inductor L41 and capacitor C43 are configured in a parallel circuit creating a tank circuit tuned to the center frequency of the FSK transmission. A dequeing resistor R47 is used to widen the bandwidth and gives a load to the common base amplifier T42. The output of the tank circuit is then output to the demodulator 323 of FIG. 4.

Figure 6:
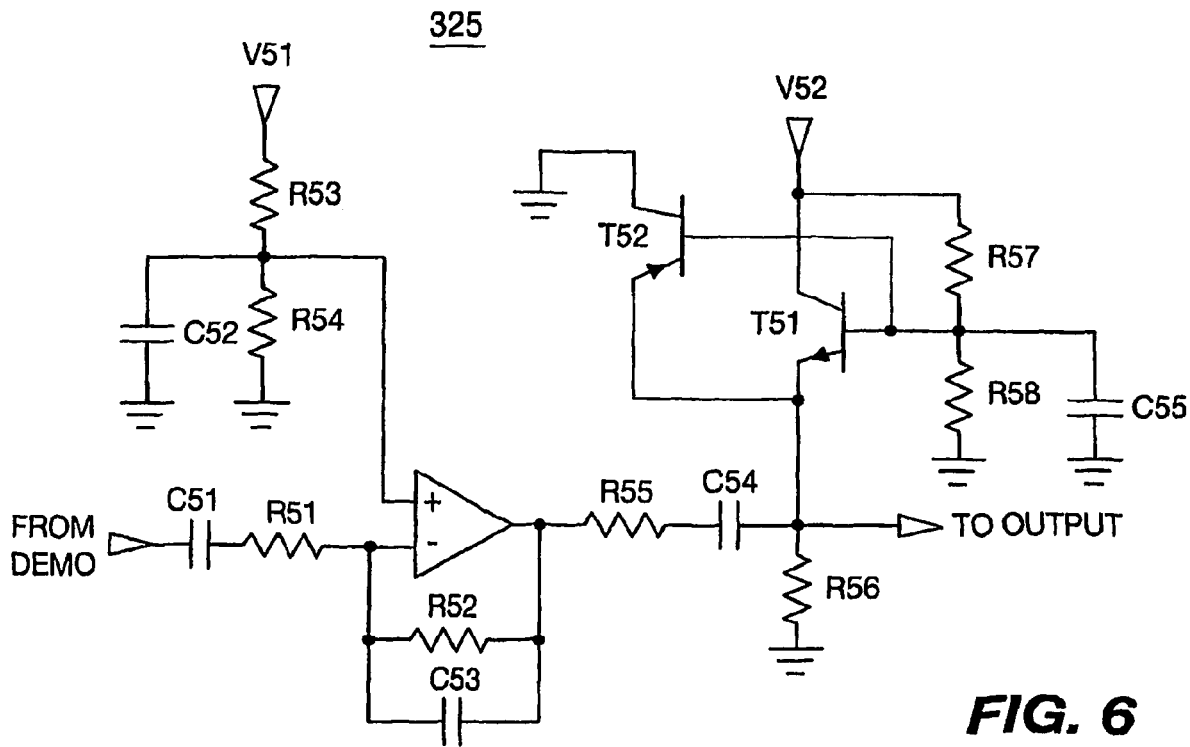
FIG. 6 is a diagram of an exemplary embodiment for implementing the present invention showing further details the amplification and data clamp circuitry 325 of FIG. 4.

FIG. 6 is a diagram of an exemplary embodiment for implementing the present invention showing further details of the amplification and data clamp circuitry 325 of FIG. 4. The amplification and data clamp circuitry 325 receives a binary signal representing FTM control signals from the demodulator 323 of FIG. 4. The amplification and data clamp circuitry 325 then amplifies or attenuates the received binary signal such that the amplitude of the binary signal is within a predetermined range such that it is suitable for coupling to the data slicer 327 of FIG. 4. In an exemplary embodiment according to the present invention, the amplification stage is configured as an inverting amplifier. Resistors R53 and R54 are configured as a voltage divider to generate the desired DC voltage at the positive terminal of operational amplifier A51. Capacitor C52 is operative to decouple and unwanted or spurious higher frequency signals from the positive terminal of operational amplifier A51. The values of resistors R51 and R52 are used to determine the overall gain of the amplification stage such that the gain is equal to the negative of R52 divided by R51. Capacitor C51 is operative to frequency limit the received binary signal. Decoupling capacitor C53 is operative to reduce unwanted noise and spurious signals from exiting the amplification stage. The gain of the amplification stage is optimally configured such that the minimum amplitude deviation expected from the demodulator 325 of FIG. 4 causes the NPN transistor T51 and the PNP transistor T52 clamps to operate. At greater deviation levels the clamp will always be on. Resistors R55 and capacitor C54 couple the amplified binary signal from the amplification stage to the data clamping stage. R55 is further operable as a current limiting resistor to insure the amplification stage is not over stressed or to ensure that distortion is not introduced into the output waveform.

The PNP transistor T52 and NPN transistor T52 are configured as a data clamp circuit. The PNP transistor T52 clamps the output voltage from an amplification stage to a first fixed level once the binary signal drops below a predetermined threshold value. This threshold value is determined by the DC value of the second voltage supply V52 and resistors R57 and R58 configured as a voltage divider. Once the binary signal level drops to a level less than the base voltage of the PNP transistor and the voltage drop from the base to the collector, commonly 0.7 volts for silicon construction, the output voltage will be clamped to the first fixed level. When the binary signal level rises to a level higher than the base voltage of the NPN transistor plus the voltage drop from the base to the emitter the output voltage will be clamped to the second fixed level. The resulting waveform is clamped to fixed predetermined levels on all cycles of the waveform and therefore has the desirable result of maintaining a fixed signal level on the output signal. This enhances signal quality and reduces error in the data slicer 327 of FIG. 4 and in the microprocessor. The microprocessor may be implemented using a digital signal processor or a universal asynchronous receiver-transmitter (UART) A UART receives data in a sequential fashion and assembles the bits into complete bytes.

As described herein, the present invention provides an architecture and protocol for enabling signal communications between an FTM and an IRD. While this invention has been described as having a preferred design, the present invention can be further modified within the spirit and scope of this disclosure. The description herein is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An apparatus comprising:
an input point receiving a frequency shift keyed (FSK) modulated signal;
an output point;
a differential amplifier coupled between said input and output points operative to amplify said FSK modulated signal, said differential amplifier including a pair of first and second transistors, said first transistor being configured as an emitter follower and said second transistor being configured as a common-base amplifier,
said first transistor having a first collector, a first base, and a first emitter, said second transistor having a second collector, a second base, and a second emitter, said first base coupled to said input point;
a band-pass filter coupled between said second collector and said output, said band-pass filter being tuned to substantially a center frequency of said FSK modulated signal;
a negative feedback path coupled between said first collector and said first base;
a first voltage divider coupled between first and second sources of reference potential operative to enable to regulate a voltage provided by said first source of reference potential and said FSK signal at said first base, said first voltage divider coupled to said first base;
a capacitor coupled between said input point and said first base; and
a bias circuit including a second voltage divider coupled between third and fourth sources of reference potential operative to enable to bias said second base.

2. The apparatus of claim 1 wherein said bias circuit includes a capacitor coupled between said second base and said fourth source of reference potential.

3. The apparatus of claim 1 wherein said band-pass filter includes a resistor operative to enable to widen a bandwidth of said band-pass filter and to provide a load to said common-base amplifier.

4. An apparatus comprising:
means for receiving a frequency shift keyed (FSK) modulated signal;
means for providing an output signal;
means including a differential amplifier for amplifying said FSK modulated signal coupled between said receiving means and said output means, said differential amplifier including a pair of first and second transistors, said first transistor being configured as an emitter follower and said second transistor being configured as a common-base amplifier,
said first transistor having a first collector, a first base, and a first emitter, said second transistor having a second collector, a second base, and a second emitter, said first base coupled to said receiving means;
means coupled between said second collector and said output means for band-pass filtering an output signal of said amplifying means, said band-pass filtering means being tuned to substantially a center frequency of said FSK modulated signal;
means coupled between said first collector and said first base for providing a negative feedback;
means including a resistor coupled between first and second sources of reference potential for regulating a voltage provided by said first source of reference potential and said FSK signal at said first base, said voltage regulating means coupled to said first base;
means including a capacitor for AC coupling said receiving means and said first base; and means including a resistor coupled between said third and fourth sources of reference potential for biasing said second base.

5. The apparatus of claim 4 wherein said biasing means includes a capacitor for providing an AC path between said second base and said fourth source of reference potential.

6. The apparatus of claim 4 wherein said band-pass filtering means includes a resistor for widening a bandwidth of said band-pass filtering means and for providing a load to said common-base amplifier.

* * * * *